(12) United States Patent
Foster et al.

(10) Patent No.: US 7,785,913 B2
(45) Date of Patent: Aug. 31, 2010

(54) SYSTEM AND METHOD FOR FORMING MOVEABLE FEATURES ON A COMPOSITE SUBSTRATE

(75) Inventors: John S. Foster, Santa Barbara, CA (US); Paul J. Rubel, Santa Barbara, CA (US); Kimon Rybnicek, Santa Barbara, CA (US); Paulo Silveira da Motta, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 944 days.

(21) Appl. No.: 11/359,558

(22) Filed: Feb. 23, 2006

(65) Prior Publication Data

US 2007/0196998 A1 Aug. 23, 2007

(51) Int. Cl.
*H01L 21/00* (2006.01)
(52) U.S. Cl. .................. 438/53; 257/419; 257/E29.324
(58) Field of Classification Search .................. 438/53; 257/419, E29.324
See application file for complete search history.

(56) References Cited

U.S. PATENT DOCUMENTS

| 6,238,580 | B1 * | 5/2001 | Cole et al. ..................... 216/2 |
| 6,440,766 | B1 * | 8/2002 | Clark .......................... 438/52 |
| 6,666,979 | B2 * | 12/2003 | Chinn et al. ................... 216/2 |
| 7,160,751 | B2 * | 1/2007 | Chilcott ....................... 438/52 |
| 2002/0160611 | A1 * | 10/2002 | Horsley ...................... 438/694 |
| 2002/0190267 | A1 * | 12/2002 | Robertson ................... 257/130 |
| 2003/0104648 | A1 * | 6/2003 | Rudhard et al. .............. 438/50 |
| 2005/0074913 | A1 * | 4/2005 | Gory et al. .................. 438/48 |
| 2005/0095833 | A1 * | 5/2005 | Lutz et al. ................... 438/597 |

* cited by examiner

*Primary Examiner*—Steven J Fulk
(74) *Attorney, Agent, or Firm*—Jaquelin K. Spong

(57) ABSTRACT

A method for forming moveable features suspended over a substrate is described, wherein a cavity beneath the moveable feature is first formed using a liquid etchant applied through one or more release holes. After formation of the cavity, the outline of the moveable feature is formed using a dry etch process. Since the moveable feature is free to move upon its formation using the dry etch process, no stiction issues arise using the systems and methods described here.

10 Claims, 6 Drawing Sheets

SYSTEM AND METHOD FOR FORMING MOVEABLE FEATURES ON A COMPOSITE SUBSTRATE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to microelectromechanical systems (MEMS) manufacturing. More particularly, this invention relates to a process for forming moveable features in a composite substrate.

Microelectromechanical systems (MEMS) are generally moveable devices created on a substrate using lithographic techniques common in semiconductor manufacturing. Often, the substrate is a composite substrate including a relatively thick "handle" wafer, a layer of sacrificial material formed or deposited on the handle wafer, and a thinner "device" layer formed or deposited over the sacrificial material in which the moveable feature is defined. After formation of the MEMS device in the device layer, the underlying portion of the sacrificial layer is removed, freeing the device for movement.

For example, a composite "silicon-on-insulator" (SOI) wafer, commonly used in MEMS fabrication, may include a thick silicon handle wafer, about 600 µm thick, over which a sacrificial layer of silicon dioxide ($SiO_2$) is grown to a thickness for example 0.5 to 2 µm. Over the silicon dioxide layer, a device layer of polycrystalline or amorphous silicon may be grown, adhered or deposited. The device layer may generally be thinner than the handle wafer, for example, between about 1 and about 80 µm thick.

Known methods for forming the moveable feature on a composite substrate include forming the moveable feature by, for example, deep reactive ion etching (DRIE). The feature is then released from the underlying oxide layer by etching the oxide layer with, for example, a hydrofluoric (HF) acid etch. Upon removal of the silicon dioxide layer beneath the moveable device, the device is free to move, being tethered to the handle wafer only by the remaining portion of the silicon dioxide layer.

Many MEMS devices are designed to be very sensitive detectors, such that the moveable features involved may have very low stiffness. For example, a MEMS accelerometer may make use of a flexible cantilevered beam, whose displacement under an acceleration is measured. Since the beam may have very low stiffness in order to achieve the desired sensitivity, it may take only a rather small adhesion force to bind the cantilever to the substrate surface, rather than suspended above it, rendering the MEMS device inoperable.

SUMMARY

One of the problems with this prior art method is that the liquid etchant used to remove the oxide layer can cause stiction between the released moveable feature and the underlying handle wafer. Upon drying, the residual liquid may have substantial meniscus forces, such that the feature remains adhered to the handle wafer even after the liquid etchant has been substantially removed, rendering the device inoperable. Prior art approaches to solving this stiction problem include sequential application of solvents of diminishing degrees of viscosity, each solvent replacing the previous solvent, such that when the final solvent is dried, only a very low viscosity liquid with weak surface tension remains, and device may be freed despite the meniscus forces of any remaining liquid. The final solution may also evaporate cleanly without pulling the released structures down to the underlying handle wafer. However, this approach adds complexity, time and cost to the manufacturing procedure, and is not always successful in producing a freely moving device.

Furthermore, using the prior art method, any additional structures deposited on the moveable features must have high selectivity to the liquid etchant, in order to survive the etch process for the sacrificial layer. Minimizing the release etch time of the moveable feature by making the feature small, or incorporating many release etch holes, may reduce the attack of previously patterned additional structures during the release etch. Alternatively, photoresist can be used to protect the additional structures, but the effectiveness of photoresist as an etch protector degrades quickly with etch time. These requirements reduce the number of materials from which the additional structures may be chosen, adds cost or complexity to the fabrication process, or impacts the design parameters of the moveable feature.

Systems and methods are described here which address the above-mentioned problems, and may be particularly applicable to the formation of singly or doubly attached moveable features. The systems and methods may form a release hole through the device layer in the area that will constitute the moveable feature. A cavity may then be etched under the portion of the device layer that will constitute the moveable feature. After etching, the outline of the feature may be defined by, for example, reactive ion etching. Upon the definition of the feature, it is already freed because it is located over the cavity which may already have been formed beneath the device layer.

Because a dry etch process is used to define the outline of the moveable feature, no stiction forces arise due to meniscus effects of an etching liquid. Furthermore, because the cavity etching takes place before the final definition of the moveable feature, additional structures, may be formed on the device without exposing the additional features to the liquid etchant. Therefore, greater design latitude is afforded by the systems and methods described here.

The systems and methods therefore include forming a moveable feature on a composite wafer including a device layer, a sacrificial layer and a handle layer, comprising forming at least one release hole in the device layer of the composite wafer; forming at least one cavity in a sacrificial layer of the composite wafer, in an area beneath the release hole; and forming the moveable feature by removing a portion of the device layer of the composite wafer, over the area of the at least one cavity.

In one exemplary embodiment, one or more cantilevers may be formed having proximal and distal ends, defined relative to an attachment point. Prior to formation of the cantilever, a cavity may be formed by etching the sacrificial layer in an area under what will be the distal end of a cantilever. The outline of the beam may then be etched in an area over the cavity, such that upon etching the outline of the cantilever beam, the beam may immediately be free of the underlying handle wafer, everywhere but at its attachment point at the proximal end.

This method is applicable to any suspended layer, such as a cantilever beam suspended over a substrate or a doubly attached membrane. It may be applied to virtually any moveable device made using a composite wafer. As used herein, the term "composite wafer" refers to a wafer having at least three layers, such as a silicon-on-insulator wafer. The top layer may be a device layer upon which the device is defined by a dry etching technique, and the device layer is disposed over a sacrificial layer which is typically removed to free the moveable device. The handle wafer may be any convenient material, such as silicon, alumina, glass, sapphire, gallium arsenide and the like. The sacrificial layer may be any material which is subsequently removed to free the device, such as a metal, metal oxide, silicon, silicon dioxide, or a polymer layer, for example. The top device layer may be any material having suitable mechanical properties for the application, such as single crystal silicon, amorphous silicon, polycrystalline silicon, silicon dioxide, a metal oxide, silicon nitride or titanium, for example, from which the cantilever or suspended membrane may be formed using dry etching techniques.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to microelectromechanical devices, wherein a small, moveable structure may be formed which is required to move relative to a substrate. In the embodiment described below, the MEMS device may be a cantilevered beam acting as an electrical switch. However, it should be understood that this embodiment is exemplary only, and that the systems and methods described herein may be applied to the formation of any of a number of devices using suspended beams and membranes, such as actuators, accelerometers and other sensors.

Figure 1:
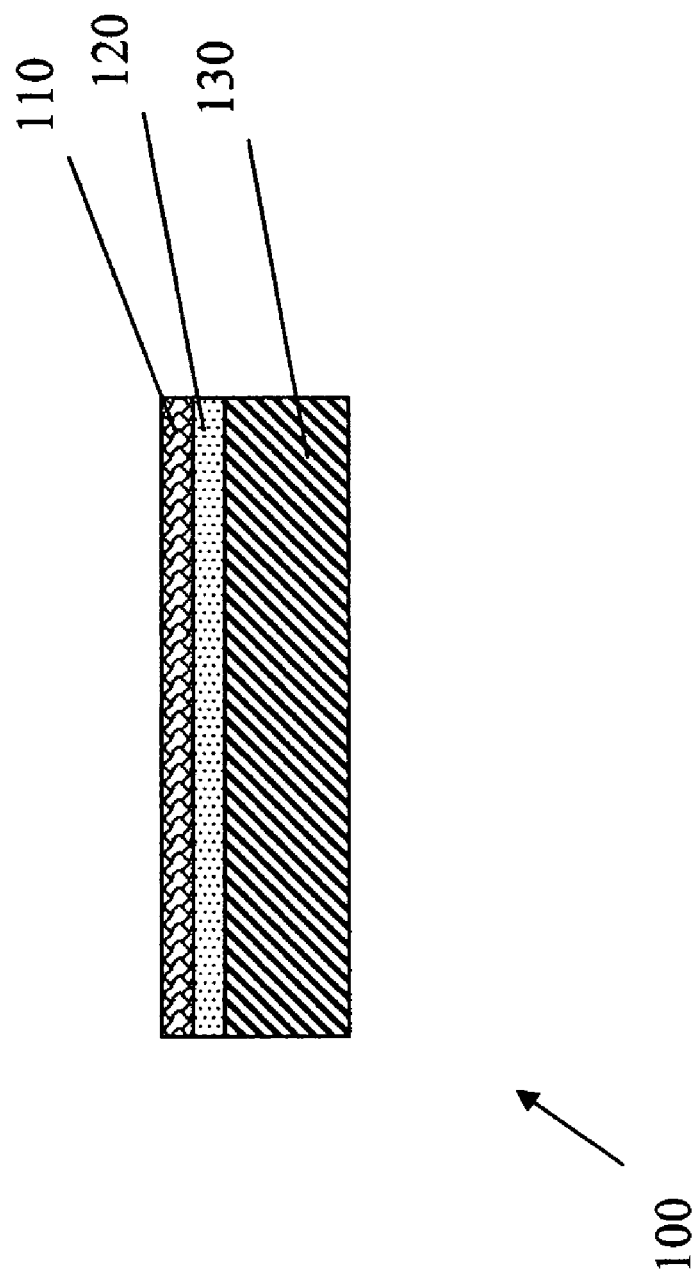
FIG. 1 is a cross sectional view showing an exemplary composite wafer.
Figure 2:
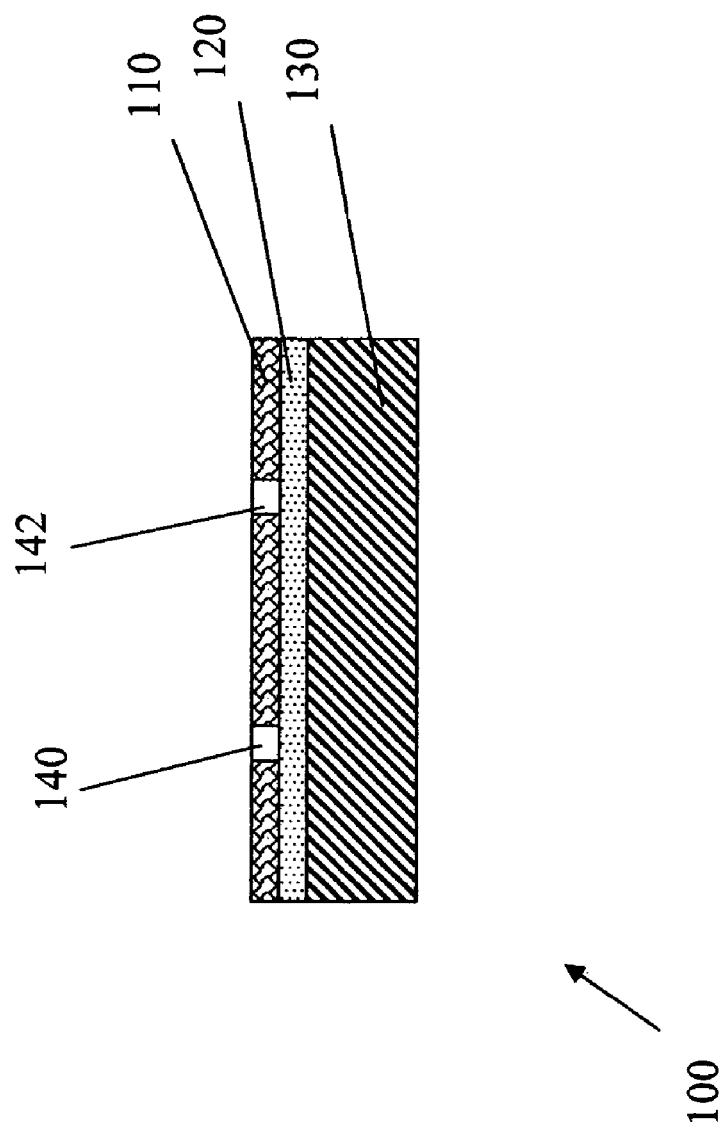
FIG. 2 is a cross sectional view of the exemplary wafer after formation of the release holes.

As previously described, MEMS devices are often fabricated on a composite wafer, the composite wafer having a device layer formed on a sacrificial layer, deposited or adhered to a relatively thick handle wafer. In one exemplary embodiment, a silicon-on-insulator (SO) wafer may be used, consisting of a relatively thick (about 600 µm) handle layer of silicon, overcoated with a thin (about 2 µm) sacrificial layer of silicon dioxide, and covered with a silicon device layer of about 5 µm thickness. Thus, fabrication of the MEMS device 100 may begin with a suitable composite wafer as shown in cross section in FIG. 1, having a silicon device layer 110, a sacrificial silicon dioxide layer 120 and a thick silicon handle layer 130. However, it should be understood that this is one exemplary embodiment, and that the composite wafer may be made from any other suitable materials. For example, the device layer of the composite substrate may include at least one of single crystal silicon, amorphous silicon, polycrystalline silicon, silicon dioxide, silicon nitride, metal oxide and titanium, and the sacrificial layer of the composite substrate may include at least one of a metal, metal oxide, silicon, silicon dioxide and a polymer, and the handle layer of the composite substrate may include at least one of silicon, sapphire, alumina, glass, gallium arsenide and a ceramic.

In one exemplary embodiment, the MEMS device 100 may be made by first forming one or more release holes 140 and 142 in the device layer 110. In one exemplary embodiment, the release holes may be substantially circular, and formed by applying a photoresist to the surface of the device layer, exposing the resist in the areas corresponding to the locations of the release holes 140 and 142, developing and removing the resist in these areas. It should be understood that non-circular release holes may also be used. The surface may then be etched according to the pattern in the photoresist, by, for example, deep reactive ion etching the release holes 140 and 142 into the device layer. Thus, the means for forming the release holes in this embodiment may be deep reactive ion etching (DRIE). Alternatively, any other method for removing material from the device layer 110, such as traditional reactive ion etching (RIE), selective wet etching or ion milling may also be used. The release holes may be then used to admit liquid etchant to the sacrificial layer 120 located beneath the device layer 110. A suitable liquid etchant may be a solution which etches the sacrificial layer 120 without affecting the device layer 110 or handle layer 130.

Figure 3:
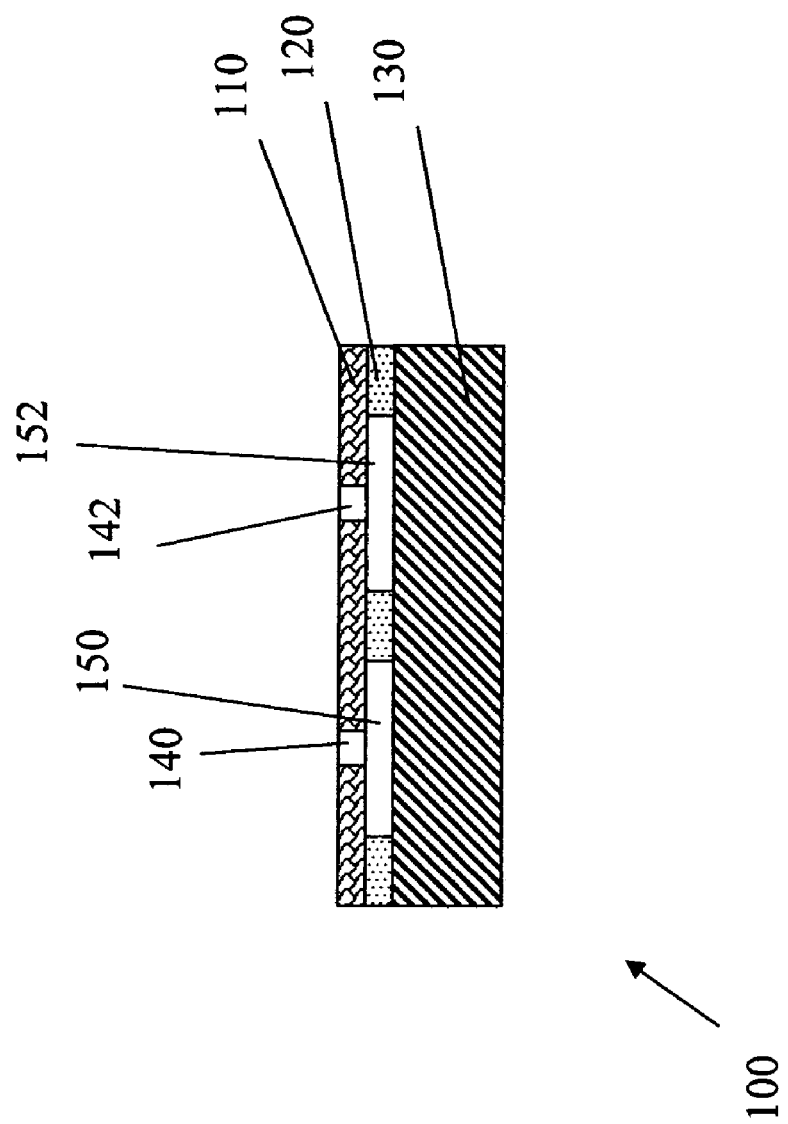
FIG. 3 is a cross sectional view of the exemplary wafer after etching of the underlying cavity through the release holes.

In one embodiment, an acid etchant, may be introduced through the release holes 140 and 142, whereby the acid etchant etches a cavity 150 and 152, respectively, in the underlying sacrificial layer 120. Exemplary cavities 150 and 152 formed by the liquid etchant are shown in FIG. 3. In one exemplary embodiment, the acid etchant is concentrated hydrofluoric (HF) acid solution, containing about 49% HF and the sacrificial layer is silicon dioxide. Thus, in this embodiment, the means for forming the cavity under the release holes 140 and 142 is hydrofluoric acid etching. This etchant etches silicon dioxide at a rate of about 1 µm per minute. By exposing the sacrificial layer 120 to the HF etchant for about 30 to 60 minutes, a cavity of diameter of about 60-120 µm results. Alternatively, any other chemical or process appropriate for etching a given sacrificial layer 120 may also be used, such as 6:1 HF buffered oxide etch (BOE), vapor phase HF etching, solvents, metal etchants, and the like.

The formation of the cavities 150 and 152 may leave an area of remaining sacrificial material 122 under the device layer, which provides support for the device layer until the cantilevered beam is formed. The location of this area 122 is well known, because the liquid etchant tends to form a cavity symmetrically about the release hole, with a diameter which depends precisely on the amount of time the liquid etchant is allowed to act. For example, as described above, using a 49% HF solution, the etch rate of the cavity is about 1 µm per minute. Therefore, although the cavity cannot be observed directly and is not formed lithographically, its size and position are well known and can be anticipated accurately in the design and placement of the release holes relative to the cantilevered beam. In one exemplary embodiment, the width of the remaining sacrificial material 122 may be about 5 µm.

Any number of supports 122 may be left, allowing the possibility for very large cavities under the device layer while minimizing the propensity for stiction of device layer membrane to the handle layer during wet processing of subsequent, intermediate layers, such as photoresist developing.

Figure 4:
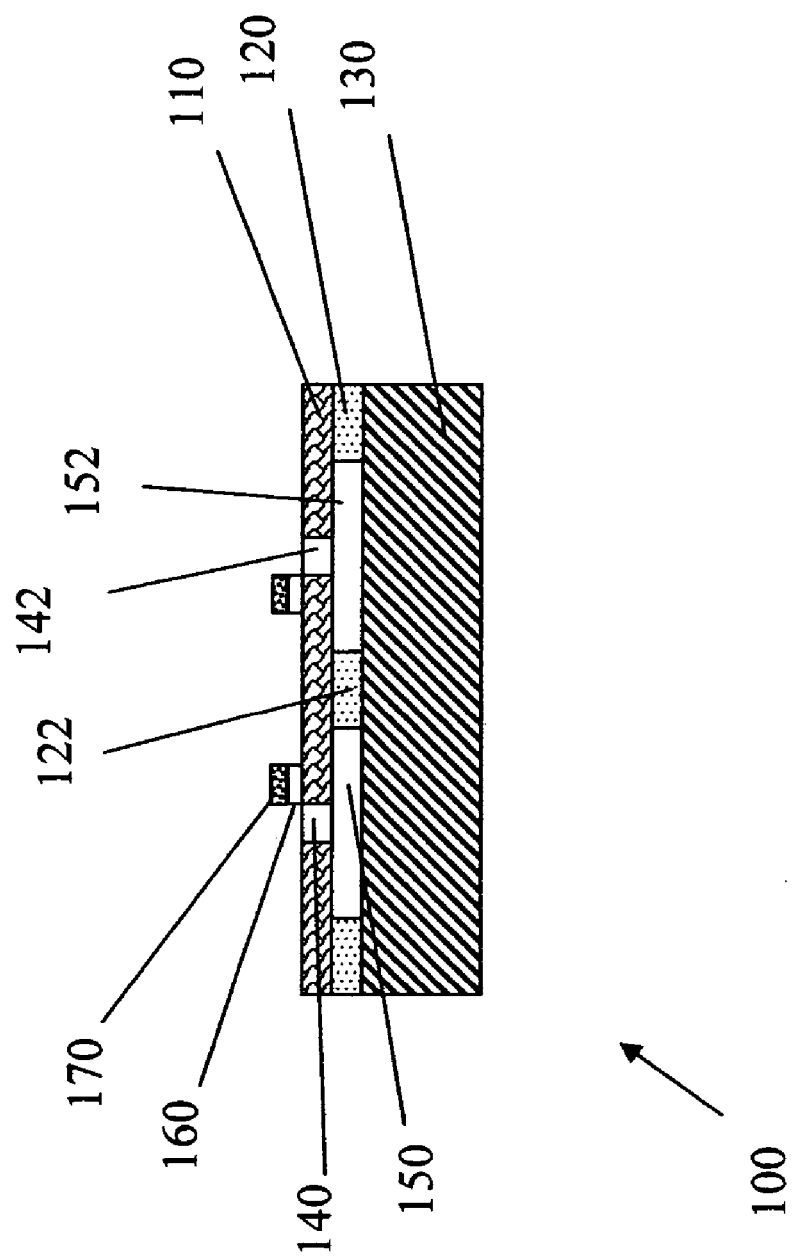
FIG. 4 is a cross sectional view of the exemplary wafer after deposition of any additional layers needed for the application.

After formation of the cavities 150 and 152 beneath the area which will be the cantilevered beam, any number of additional films 160 and 170 may be patterned and or deposited on the device layer surface 110. For example, if a cantilevered beam is to be formed in the device layer, additional films which are to remain on the cantilevered beam may be deposited at this point. FIG. 4 is a cross section of the substrate after formation of the cavities 150 and 152 and the deposition of additional layers 160 and 170.

In one exemplary embodiment, the additional layers 160 and 170 are an insulating layer 160 and a contact layer 170. The insulating layer 160 may be, for example, a layer of patterned silicon dioxide, on the order of about 0.2 µm thick, which prevents electrical signals from flowing from the silicon device layer 110 to the contact layer 170. The contact layer 170 may actually be a multilayer comprising first a thin layer of chromium (Cr) for adhesion to the silicon dioxide surface. The Cr layer may be from about 50 Angstroms to about 100 Angstroms in thickness. The Cr layer may be followed by a 100 Angstrom thick layer of molybdenum (Mo), and finally a thicker layer about 3000 Angstroms to about 5000 Angstroms of gold (Au) as a conductive metallization layer. The purpose of the Mo layer is to prevent diffusion between the Cr and the Au, which would otherwise dramatically increase the resistance of the Au. The overall thickness of the Cr/Mo/Au multilayer may therefore be about 0.3 to about 0.5 µm, and the Cr/Mo/Au multilayer may be used as a contact electrode or shunt bar if the MEMS device is to be used as an electrical switch.

An advantage of this invention is that layers 160 and 170 may be deposited on the cantilevered beam using materials which are otherwise vulnerable to the acid etchant, because they are deposited after the cavity is etched, rather than before. There is similarly no maximum time that the device may be exposed to the etchant, and no maximum size, because the cavity is etched before the device is formed. Very long etch times are allowed in conjunction with highly concentrated etchants, making it possible to release very large structures with a minimum of release holes. Release holes generally decrease the functionality of the MEMS device by decreasing its active area The systems and methods described here therefore provide greatly enhanced process and design flexibility compared to the prior art procedure, wherein the exposure time of the device to the etchant, or its size may have to be limited, or the selection of materials in the additional layers 160 and 170 may be limited, because the layers in the device may be vulnerable to the etchant.

Figure 5:
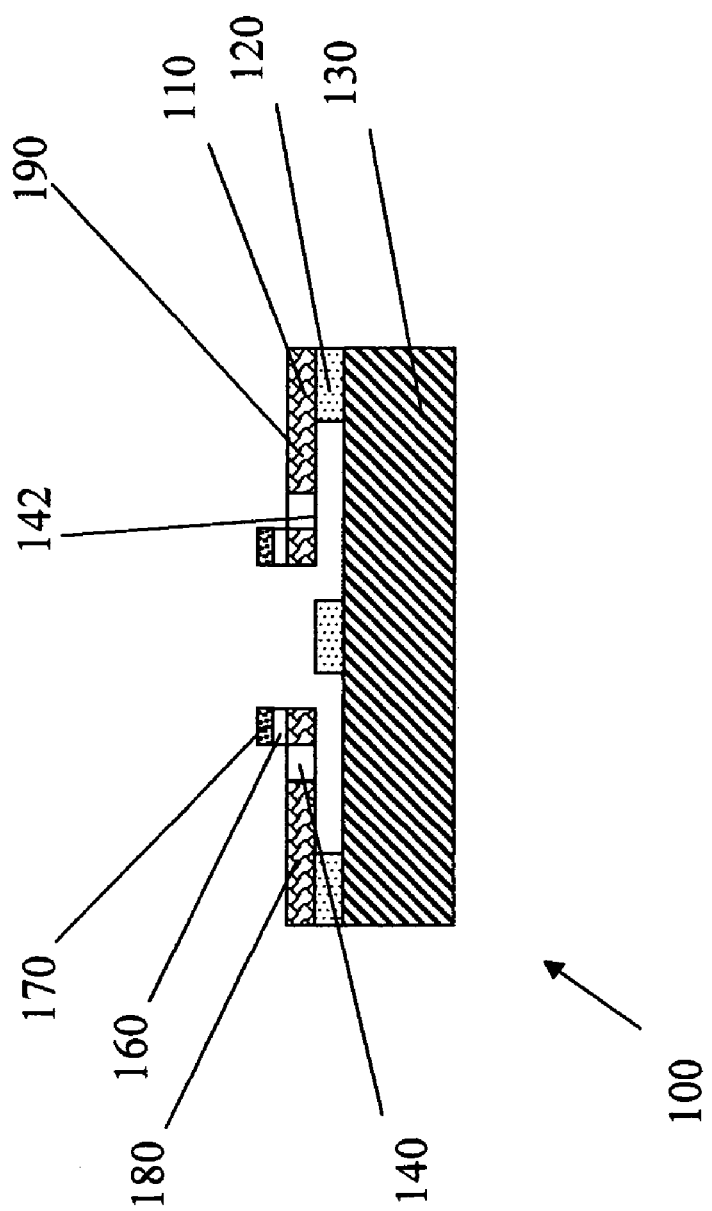
FIG. 5 is a cross sectional view of the exemplary wafer after definition of the cantilevered beams.

FIG. 5 is a cross section of the exemplary wafer after the formation of the MEMS device 100. In this exemplary embodiment, the MEMS device 100 comprises two cantilevered beams 180 and 190, which are formed over the two cavities 150 and 152, respectively. However, it should be understood that this embodiment is exemplary only, and that a single cantilever or more than two may also be formed using the systems and methods described herein. Similarly, a membrane may be formed which is attached in at least two places, or at various locations around its periphery.

In one exemplary embodiment, the cantilevered beams 180 and 190 are formed by first applying photoresist to the substrate surface, exposing and developing the photoresist in a pattern corresponding to the desired outline of the cantilevered beams, and then deep reactive ion etching (DRIE) the outline of the beams 180 and 190. Thus, the means for forming the moveable features may be deep reactive ion etching and the means for subsequently stripping the patterning resist may be oxygen ($O_2$) plasma stripping. However, it should be understood that any other dry etching technique, such as ion milling or more traditional reactive ion etching (RIE) processing, may also be used to define the cantilevered beams 180 and 190.

Advantageously, upon formation of the cantilevered beams 180 and 190 using the DRIE technique, the cantilevered beams are immediately free to move, and no further release steps are needed to free the moveable device. Since no liquids are used after the formation of the cantilevered beams, no stiction issues associated with such liquids exist with this method.

Figure 6:
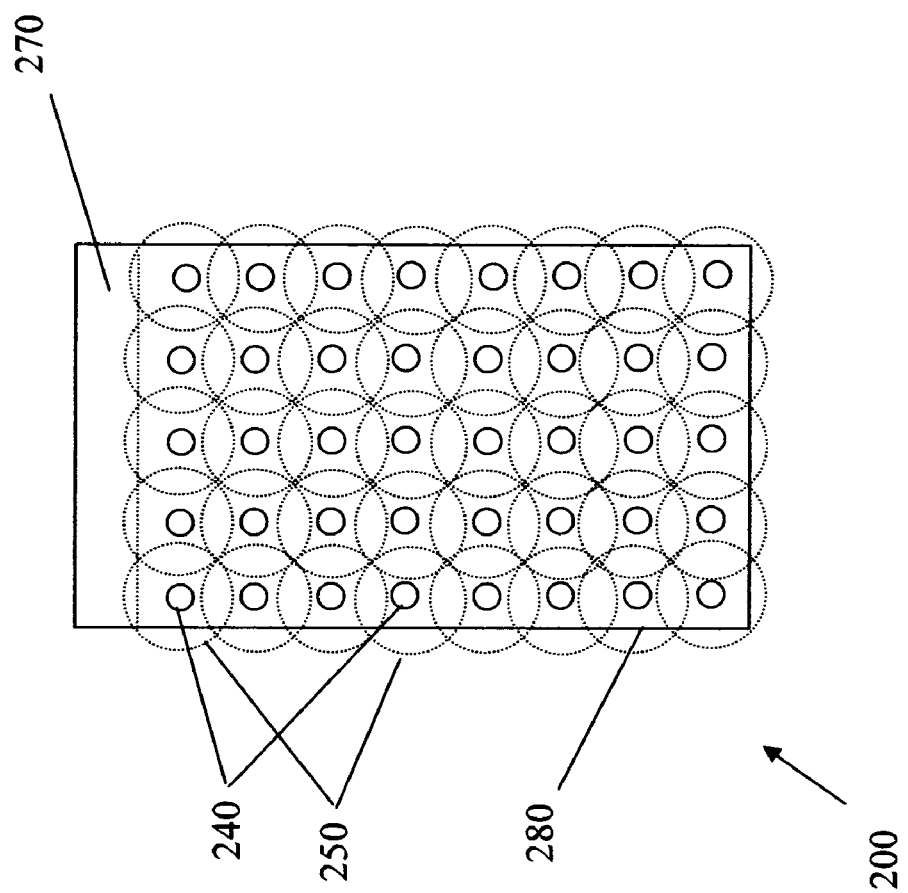
FIG. 6 is a plan view of an exemplary embodiment of a wide cantilever beam after formation of the release holes and etching of the underlying cavity.

Although the cantilevered beams 180 and 190 are shown disposed each over a single cavity 150 and 152 and corresponding release holes 140 and 142, it should be understood that far more release holes and cavities may be used to form a cavity under a larger suspended body. For example, FIG. 6 is a plan view of a larger cantilevered beam 280, which is released by forming a plurality of release holes 240 across the width of the cantilevered beam 280. Additionally, very large cavities can be created in which dense arrays of moving structures are formed in the final beam defining etch over each cavity.

Each of the release holes 240 may be, for example, about 5 to about 20 µm in diameter, and more preferably about 10 µm in diameter, and the introduction of the hydrofluoric acid through the release holes 240 may result in the formation of corresponding substantially circular cavities 250, positioned symmetrically about each of the release holes 240, which may be about 60 to about 120 µm in diameter, and more preferably about 90 µm in diameter. Accordingly, by disposing the release holes about 60 µm apart, the corresponding cavities may have overlapping outer boundaries, so that a continuous cavity is formed having a corrugated edge.

The density and dimensions of the release holes 240 may be chosen with regard to the required mechanical properties of the resulting beam, as a preponderance of release holes may affect the stiffness of the beam. Using the concentrated hydrofluoric acid solution described above, the etch rate of the cavities may be about 1 µm per minute, such that the diameter of the resulting cavities may be tightly controlled. The oxide layer may remain in the area 270 underlying the proximal portion of the cantilevered beam 280, attaching it to the handle layer below.

It should be understood that although the systems and methods have been described with respect to a cantilevered beam embodiment, the systems and methods are equally applicable to other types of suspended members, such as doubly attached membranes, or rectangular membranes attached at the corners, or other shapes of membranes attached at the edges or in certain areas.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes an embodiment including a silicon-on-insulator wafer, it should be understood that this embodiment is exemplary only, and that the systems and methods disclosed here may be applied to any number of alternative composite wafers. Similarly, the embodiment is described with respect to hydrofluoric acid as the wet etch and deep reactive ion etching as the dry etch step. However, it should be understood that other embodiments are envisioned using other wet etch, dry etch and vapor phase etch techniques. In addition, while the systems and methods are described relative to a MEMS switch embodiment, it should be understood that the systems and methods may be applied to the fabrication of any of a number of difference MEMS devices, such as, for example, actuators, sensors, accelerometers, optical switches, radio frequency (rf) filters, transducers and other devices. Accordingly, the exemplary implementations set forth above, are intended to be illustrative, not limiting.

What is claimed is:

1. A method for forming a moveable feature on a composite wafer including a device layer, a sacrificial layer and a handle layer, comprising:
    forming at least one release hole in the device layer of the composite wafer;
    forming at least one cavity in a sacrificial layer of the composite wafer, in an area beneath the release hole;
    forming at least one metal structure on the device layer; and
    forming the moveable feature, wherein the moveable feature includes the release hole, and wherein the moveable feature is formed by removing a portion of the device layer of the composite wafer, over the area of the at least one cavity, and wherein the movable feature is formed after the at least one cavity, the at least one metal structure and at least one release hole are formed.

2. The method of claim 1, wherein forming the at least one release hole comprises forming the at least one release hole using reactive ion etching.

3. The method of claim 1, wherein forming the at least one release hole includes forming at least two release holes so positioned that the corresponding cavities have overlapping outer boundaries, and form a single cavity with a corrugated outline.

4. The method of claim 1, wherein forming the at least one cavity comprises forming the at least one cavity by applying a liquid acid to the sacrificial layer of the composite wafer through the release holes formed in the device layer of the composite wafer.

5. The method of claim 4, wherein the movable feature comprises a membrane attached to the device layer in at least two places.

6. The method of claim 1,
    wherein forming the moveable feature comprises forming the moveable feature using deep reactive ion etching on the device layer of the composite wafer, and wherein the movable feature is formed after the at least one release hole is formed.

7. The method of claim 1, wherein the device layer of the composite substrate comprises at least one of single crystal silicon, amorphous silicon, polycrystalline silicon, silicon dioxide, silicon nitride, metal oxide and titanium, and the sacrificial layer of the composite substrate comprises at least one of a metal, metal oxide, silicon, silicon dioxide and a polymer, and the handle layer of the composite substrate comprises at least one of silicon, sapphire, alumina, glass, gallium arsenide and a ceramic.

8. The method of claim 1, wherein the at least one metal structure is an electrical contact and is insulated from the device layer by an insulating layer of silicon dioxide, and wherein the at least one electrical contact and the insulating layer are formed before the movable member is formed, and are formed on a side of the device layer opposite a side facing the handle layer.

9. The method of claim 8, wherein the electrical contact comprises a multilayer of chromium, molybdenum and gold.

10. An apparatus for forming a moveable feature on a composite substrate including a device layer, a sacrificial layer and a handle layer, comprising:
    means for forming at least one release hole in the device layer of the composite wafer;
    means for forming at least one cavity in a sacrificial layer of the composite wafer, in an area beneath the release hole;
    means for forming at least one metal structure on the device layer; and
    means for forming the moveable feature after formation of the at least one release hole and at least one cavity, wherein the moveable feature includes the release hole, and wherein the moveable feature is formed by removing a portion of the device layer of the composite wafer, over the area of the at least one cavity and wherein the movable feature is formed after the at least one cavity, the at least one metal structure and at least one release hole are formed.

* * * * *